United States Patent [19]

Nishino

[11] Patent Number: 5,966,727

[45] Date of Patent: Oct. 12, 1999

[54] COMBINATION FLASH MEMORY AND DRAM MEMORY BOARD INTERLEAVE-BYPASS MEMORY ACCESS METHOD, AND MEMORY ACCESS DEVICE INCORPORATING BOTH THE SAME

[75] Inventor: Kenjiro Nishino, Yokohama, Japan

[73] Assignee: Dux Inc., Toyko, Japan

[21] Appl. No.: 08/876,662

[22] Filed: Jun. 16, 1997

[30] Foreign Application Priority Data

Jul. 12, 1996 [JP] Japan .................................. 8-183330

[51] Int. Cl.[6] ...................................................... G06F 12/02
[52] U.S. Cl. .......................... 711/127; 711/104; 711/105; 395/281
[58] Field of Search .................................... 711/104, 105, 711/127; 395/281; 365/52, 185.11

[56] References Cited

U.S. PATENT DOCUMENTS

| | | |
|---|---|---|
| 5,335,340 | 8/1994 | Strong . |
| 5,341,489 | 8/1994 | Herberger et al. .................. 365/185.11 |
| 5,463,742 | 10/1995 | Kobayashi ............................... 395/281 |
| 5,513,135 | 4/1996 | Dell et al. .................................. 365/52 |

FOREIGN PATENT DOCUMENTS

| | | |
|---|---|---|
| 0 566 306 A2 | 10/1993 | European Pat. Off. . |
| 0 657 825 A1 | 6/1995 | European Pat. Off. . |
| WO 95/34030 | 12/1995 | WIPO . |

*Primary Examiner*—John W. Cabeca
*Assistant Examiner*—Mehdi Namazi
*Attorney, Agent, or Firm*—Davis and Bujold

[57] ABSTRACT

A memory board which functions as a main memory of a CPU, is accessible at high speed and is usable in a disk manner is proposed. A flash memory and a D-RAM are mounted on the memory board. The flash memory has a S-RAM interface which synthesizes a row address and a column address transmitted via an address bus, through a latch circuit or a signal processing circuit, to define an address. The CPU, when accessing an address in the flash memory, converts an address signal using an interleave rule in reverse, and transmits the converted address to a system logic. As a result, data can be written into contiguously allotted addresses in the flash memory. The flash memory can thus be used in a disk-like manner.

23 Claims, 11 Drawing Sheets

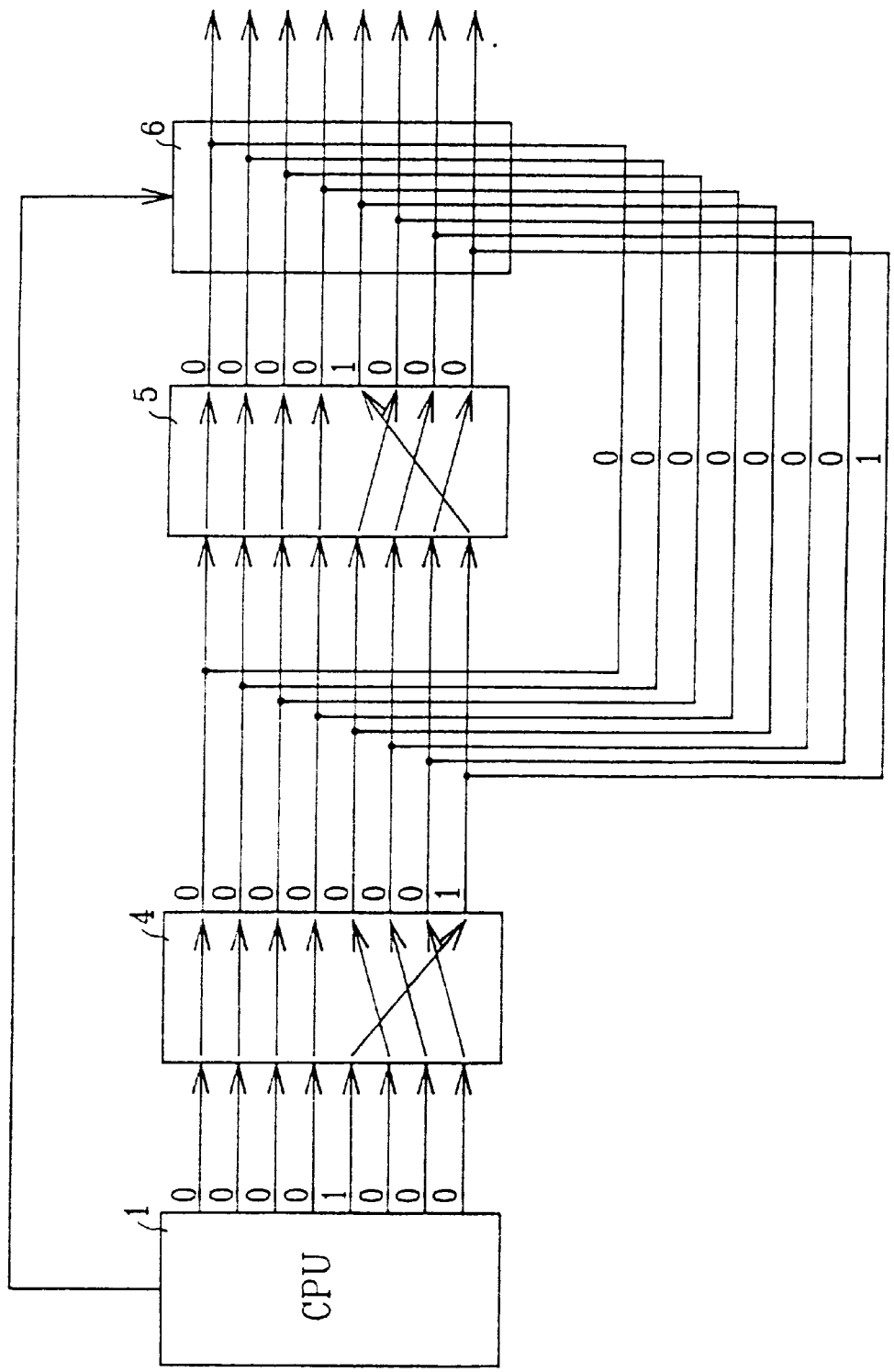

FIG. 11
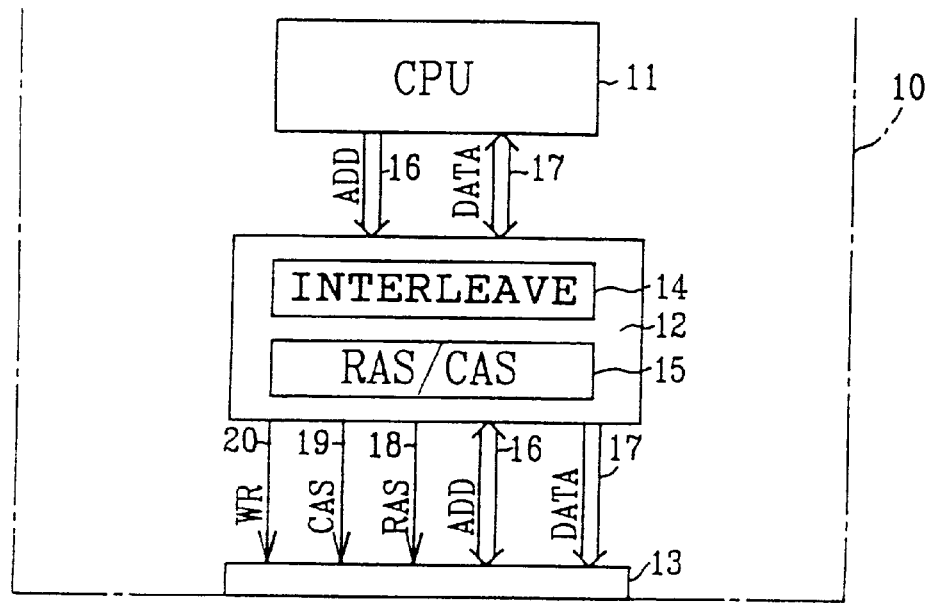
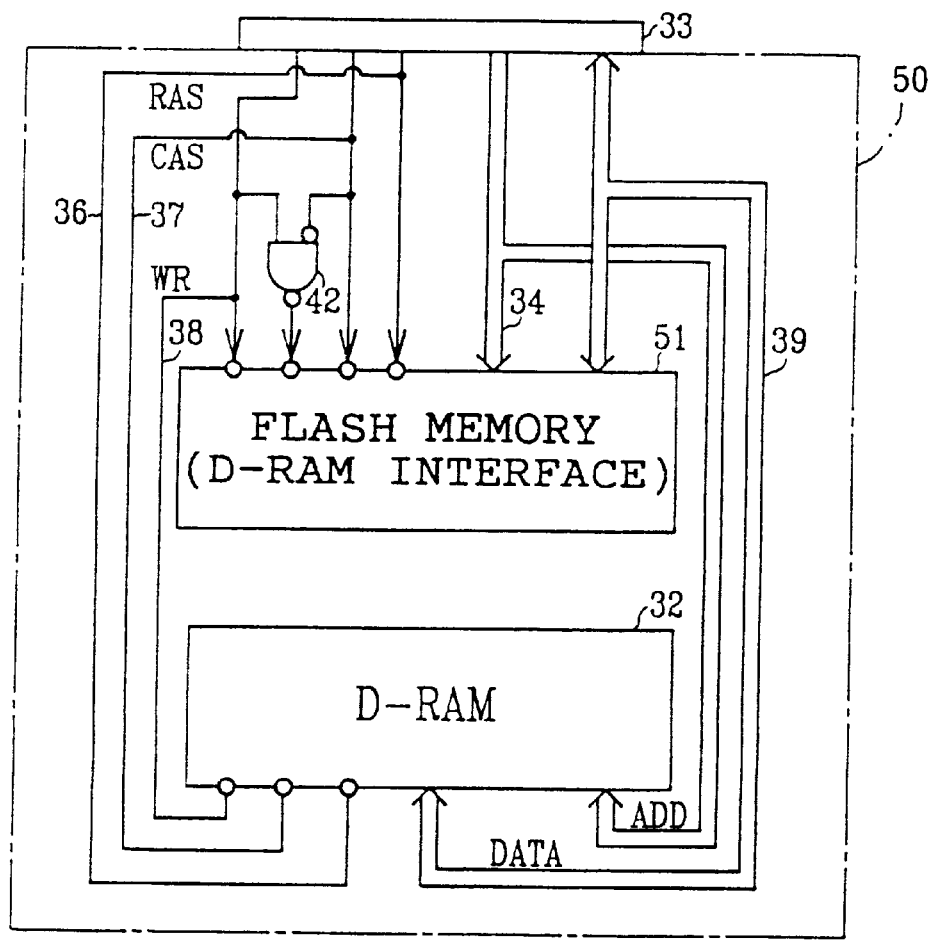

5,966,727

COMBINATION FLASH MEMORY AND DRAM MEMORY BOARD INTERLEAVE-BYPASS MEMORY ACCESS METHOD, AND MEMORY ACCESS DEVICE INCORPORATING BOTH THE SAME

FIELD OF THE INVENTION

This invention relates to a memory board, a memory access method and a memory access device, and particularly to a memory board for use as a disk or as a main memory of central processing unit (hereinafter referred to as CPU).

BACKGROUND OF THE INVENTION

Recently, electronic apparatuses with a microcomputer built therein are smaller in size. During operation of a known small-sized electronic apparatus, a memory board is attached in a memory slot of a microcomputer board with the CPU or system logic mounted thereon.

Presently, such memory board is a main memory of the CPU and is provided with a dynamic random access memory (hereinafter referred to as D-RAM) which is small in size and large in capacity. In the D-RAM, row and column addresses are arranged and one address is designated in a matrix manner. Therefore, the system logic has therein a logic for classifying an address signal transmitted from the CPU into the row address and the column address.

The system logic also has therein an interleave logic in which, for efficiently accessing the D-RAM, the D-RAM is divided into a plurality of banks, and an address signal transmitted from the CPU is converted such that adjoining addresses are allotted to individual banks.

However, since the memory in D-RAM is lost when power supply is disconnected, data cannot be stored in the aforementioned memory board. Therefore, a need exists for a memory board that can store data even when the power supply is disconnected.

To fulfill such need, an erasable and programmable read only memory (hereinafter referred to as EP-ROM) can be mounted on the memory board. However, EP-ROM requires ultraviolet radiation for deleting data, all the data is deleted at once, and thus EP-ROM cannot be partially written or erased.

These days a nonvolatile flash memory that can be partially written or erased is desired. However, in the flash memory, addresses are allotted contiguously and data is processed at an insufficiently high rate for the main memory of CPU.

SUMMARY OF THE INVENTION

Wherefore, an object of the present invention is to provide a memory board accessible at a high rate as a main memory of CPU and operable in a disk manner.

Another object of the present invention is to efficiently read and write data from and to the memory on the memory board.

To attain these and other objects, the invention provides a memory board attached to a memory slot of a microcomputer board with the CPU mounted thereon for use, and composed of D-RAM and a flash memory as memory elements. The D-RAM and the flash memory are connected to the CPU on the microcomputer board via a data bus, an address bus and a control signal line such that the D-RAM and the flash memory are accessible from the CPU on the microcomputer board.

In the memory board, since the CPU can access both the D-RAM and the flash memory, D-RAM can be used as the main memory and the flash memory can be used as a disk memory. In the flash memory, data is retained even when the power supply is disconnected. When the power supply is again connected, the previously stored data or programs can be read from the flash memory. Different from the EP-ROM or other nonvolatile memory from which all the data is deleted as required, the flash memory can be partially written or erased and used in a disk manner.

In the memory board according to the present invention, the flash memory is a memory element having S-RAM interface, and the address bus is connected to the flash memory by two routes: one first route having a latch circuit and the other second route having no latch circuit. A row address strobe line (hereinafter referred to as RAS) is connected to the latch circuit such that an operation signal is transmitted to the latch circuit at the time a row address signal is transmitted to the address bus. The row address strobe line and a column address strobe line (hereinafter referred to as CAS) are connected to the flash memory, via a predetermined signal processing circuit, such that a signal for defining the address is transmitted to the flash memory at the time a column address signal is transmitted to the address bus.

It is determined, with an operation pulse transmitted from RAS and CAS, whether an address signal transmitted from the microcomputer board to the address bus is to specify the row address or the column address, thereby specifying the address arranged in a matrix manner in the D-RAM.

The row address and the column address are now explained. Provided that an address signal defines one address in 24 bits, two signals are transmitted from the microcomputer board each in 12 bits. The address signal of 24 bits transmitted from CPU is divided, by the system logic on the microcomputer board, into an upper 12 bits and a lower 12 bits. The row address is defined by the upper 12 bits, while the column address is defined by the lower 12 bits. Therefore, one address is defined among the memory location allotted like the matrix in the D-RAM.

Since in the flash memory addresses are allotted contiguously, any address cannot be specified with the address signal divided for the row address and the column address. In the memory board according to the present invention, the latch circuit is driven by a control signal transmitted to RAS, latching the row address. It is determined by a control signal transmitted to RAS and CAS whether or not the column address is specified. After taking the row address and the column address from the latch circuit and the address bus, respectively, the row address and the column address are synthesized to define one address.

In the memory board, the conventional flash memory having S-RAM interface can coexist with the D-RAM, and the disk memory function of the flash memory is compatible with the main memory function of the D-RAM.

In the memory board, the flash memory is a memory element having the D-RAM interface. The flash memory and the D-RAM are interconnected parallel with each other relative to RAS and CAS.

Since the flash memory is provided with the D-RAM interface, when an address signal divided in a row address signal and a column address signal is transmitted to the flash memory, the address signal is processed internally and the address in the flash memory can be defined.

When the flash memory provided with the D-RAM interface is mounted, the memory board can be accessed at a high rate as the main memory of the CPU and the disk memory, without having a latch circuit or other outside.

In the memory board according to the invention, the flash memory has a disk-like deletion procedure memory portion, e.g. a program processable by the CPU mounted on the microcomputer board, for storing process steps for deleting data by blocks of units from a memory area composed of a plurality of blocks having a specified unit of bytes with contiguous addresses.

When the memory board is attached to the microcomputer board and a power supply is connected, the contents stored in the disk-like deletion procedure memory portion is installed in the memory board. Specifically, the program representing the disk-like deletion procedure stored in the flash memory is installed in the D-RAM, a main memory of the CPU. The flash memory can be used as a disk memory, by deleting or rewriting the data in the flash memory by blocks of units having contiguous addresses, as required, according to the program installed in the D-RAM. The installation of program can be done by another memory unit. However, by storing the program in the flash memory beforehand, such additional memory unit is obviated, thereby simplifying the structure. Since the flash memory is non-volatile, the program stored in the flash memory can be installed in the D-RAM at any time, if required.

In the memory board according to the invention, the flash memory can have an interleave cancel procedure memory portion, e.g. a program processable by the CPU mounted on the microcomputer board, for storing process steps for substantially canceling the interleave operation executed by the microcomputer board and writing data in contiguously allotted addresses in the flash memory.

Usually, when the D-RAM is used as the memory unit, an address signal transmitted from the CPU is converted, through interleave operation on the system logic of the microcomputer board, such that the D-RAM can be accessed efficiently. In the interleave operation, adjoining addresses are allotted into separate banks. The interleave operation would replace contiguous addresses transmitted from the CPU with discontinuous addresses. If data is written into the flash memory connected to the microcomputer board provided with the system logic for executing the interleave logic as it is, for example, one program would be stored in discontinuous or separate addresses in the flash memory. Consequently, the program cannot be deleted or re-written, because the blocks of units having contiguous addresses is deleted from the flash memory.

When the memory board, according to the invention, is connected to the microcomputer board in which the interleave operation is executed, the program stored in the interleave cancel procedure memory portion in the flash memory is first installed in the D-RAM. When data is written to the flash memory, the interleave operation is substantially canceled. When the interleave operation is canceled, the address signal to be transmitted to the memory board becomes identical to contiguous address signal transmitted from the CPU. Therefore, a series of program or data are prevented from being written in discontinuous or separate addresses of the flash memory.

In the memory board according to the invention, the flash memory has an identification information memory portion for storing identification information with which the CPU can identify the flash memory. Specifically, the ID number or other identification information of the flash memory is registered in the identification information memory portion, and the ID number of the flash memory is read from the identification information memory portion by transmitting a ID read command from the CPU.

The registered identification information permits the CPU to easily determine which contiguous addresses in the memory board correspond to the addresses of the flash memory. After identifying the addresses of the flash memory, it is determined whether or not the addresses to which data is written by the CPU correspond to that of the flash memory. When writing data to the addresses of the flash memory, the interleave operation is substantially canceled. On the other hand, data is read from or written to the D-RAM, the D-RAM is accessed efficiently through the interleave operation. Based on the addresses to be accessed, the interleave operation is executed or canceled. The memory board can thus be used as a main disk memory.

In the memory board according to the invention, the identification information indicates the number of accessible bits once the flash memory is accessed. For example, when the CPU is of 32 bits and data of 32 bits is read from or written to the flash memory of only 8 bits, a data read/write instruction must be transmitted from the CPU four times. For this purpose, by informing the CPU of the number of bits of the flash memory, a read/write instruction is transmitted four times from the CPU of 32 bits, and data of 32 bits is read from or written to the flash memory of 8 bits.

In the memory board according to the invention, the flash memory has a corresponding bit number difference deletion procedure memory portion e.g. a program processable by the CPU on the microcomputer board, for storing process steps for deleting difference in the number of bits between the CPU and the flash memory, by transmitting a read/write instruction from the CPU on the microcomputer board to the flash memory, substantially repeatedly corresponding to the number of bits of the flash memory, when the number of bits of the flash memory differs from the number of bits of the CPU on the microcomputer board.

By first installing the program stored in the corresponding bit number difference deletion procedure memory portion in the main memory of the CPU, the difference in the number of bits between the CPU and the flash memory can be eliminated.

In order to efficiently read or write data from or to the memory board, the invention provides a memory access method for converting an address designated by the CPU, through an interleave operation, and transmitting the converted address to a memory unit when reading or writing data from or to the memory unit. The memory unit is provided with memory elements composed of a D-RAM and a flash memory connected via a data bus, an address bus and a control signal line to the CPU such that the CPU can access the D-RAM and the flash memory. The address designated by the CPU is converted using the interleave operation rule in reverse before the interleave operation is executed, such that the address, converted through the interleave operation, coincides with the original address designated by the CPU, when the address designated by the CPU corresponds to the address in the flash memory.

In the memory access method, when the memory unit is provided with the flash memory and the D-RAM, an address signal is transmitted to the flash memory with the interleave operation being substantially canceled.

The idea of the interleave operation is now explained together with the process steps of the memory access method.

Provided that an address signal of 8 bits is transmitted from a CPU 1, as shown in FIG. 1A, when any one of the eight bits is displaced in an interleave logic 2, the address signal "0001000" transmitted from the CPU 1 is converted to a signal "00000001". Provided that a signal "00001000" is transmitted from the interleave logic 2 as shown in FIG. 1B, a signal "00000100" should be transmitted from the CPU 1 to the interleave logic 2. If the address signal transmitted from the CPU 1 is transmitted to the memory unit as it is, an address signal is obtained by inversely converting the address signal to be transmitted from the CPU 1 according to the conversion rule in the interleave logic 2, and the obtained address signal is transmitted to the interleave logic 2.

In the memory access method, using the idea shown in FIGS. 1A and 1B, when the CPU has an access to the flash memory, the address designated by the CPU is converted to an address following the interleave rule in reverse, before the interleave operation is executed, thereby substantially canceling the interleave operation. Because the interleave operation is substantially canceled, data can be written to allotted addresses of the flash memory contiguously. The flash memory can thus be used in a disk manner.

In the memory access method, when the D-RAM is accessed, the interleave operation is executed, and the data is read from or written to not contiguously allotted addresses in the D-RAM. Therefore, the D-RAM can be accessed at high speed.

In the memory access method according to the invention, the CPU has access to each of the memory elements of the memory unit, identifies which memory element corresponds to the flash memory and, according to the result of identification, determines whether the address to be designated by the CPU corresponds to the address in the flash memory or the address in the D-RAM.

In the memory access method, by accessing each memory element of the memory unit, the flash memory is identified and the addresses contiguously allotted in the flash memory are also identified beforehand. When the CPU accesses the memory unit, it is determined with the identified addresses whether or not the memory element to be accessed is the flash memory. If the flash memory is accessed, the process steps for substantially canceling the interleave operation are executed.

In the memory access method, when the flash memory differs from the CPU in the number of accessible bits once the flash memory is accessed, the read/write instruction transmitted from the CPU is repeated corresponding to the number of bits of the flash memory, thereby eliminating the difference in the number of bits between the CPU and the flash memory.

Even if the CPU differs from the flash memory in the number of bits, the flash memory is treated as if the number of bits of the flash memory is the same as that of the CPU.

In order to efficiently read or write data from or to the memory board, a memory access device according to the invention is provided with a CPU, and a system logic connected to an address bus of the CPU. In the system logic an interleave unit is built for converting an address signal transmitted from the CPU, according to a specified rule, and transmitting the converted address signal to a memory unit. The memory unit is provided with memory elements composed of a D-RAM and a flash memory connected in parallel with each other via a data bus, an address bus and a control signal line, such that the D-RAM and the CPU can access the flash memory. The memory access device is also provided with a memory element identification unit for determining whether or not the memory element to be accessed by the CPU for reading or writing data corresponds to the flash memory. The memory access device is further provided with an interleave cancel unit for substantially inhibiting the interleave operation, when the memory element identification unit determines that the memory element from or to which data is to be read or written is the flash memory.

In the memory access device, when the CPU accesses memory elements, the memory element identification unit determines whether the CPU accesses the D-RAM or the flash memory. When the D-RAM is accessed, the interleave cancel unit does not work, and the D-RAM is efficiently accessed according to the address signal converted by the interleave unit in the system logic. Therefore, data can be securely read or written at high speeds, which requirement is demanded for the main memory of the CPU. On the other hand, when the flash memory is accessed, the interleave cancel unit operates, and the flash memory is accessed according to the contiguous address signals transmitted from the CPU. A series of data can be written to contiguous addresses in the flash memory. The data can be easily re-written or replaced. The memory access device can form a small-sized computer system composed of the D-RAM, as a main memory, and the flash memory, as a disk memory. Additionally, the accessibility of the D-RAM is not impaired, and the D-RAM can be accessed at high speed. Data can be read from or written to the D-RAM at high speed.

In the memory access device, the interleave cancel unit converts an address designated by the CPU using the specified rule, in reverse, and transmits the converted address to the interleave unit, such that the address converted by the interleave unit coincides with the original address designated by the CPU.

In the memory access device, the interleave operation is substantially canceled in the aforementioned memory access method and the flash memory can be used as a disk memory. Such function can be realized in a software manner according to a program. When the memory unit is detachably attached to the microcomputer board like the aforementioned memory board, a program for substantially canceling the interleave operation is stored in the flash memory and the program stored in the flash memory is installed in the D-RAM as the main memory of the CPU.

In the memory access device, an address bus connected to the interleave unit is provided with a first output bus passing a second interleave unit for converting an address signal transmitted from the interleave unit in reverse to an input signal transmitted to the interleave unit, and a second output bus bypassing the second interleave unit. The interleave cancel unit substantially inhibits the interleave operation when data is read from or written to the flash memory, by changing over the first output bus and the second output bus.

In the memory access device, as shown in FIG. 2, the system logic is provided with a first interleave logic 4 and a second interleave logic 5. A route leading from the CPU 1 is branched into a route for transmitting an output from the first interleave logic 4 to the second interleave logic 5 and a route bypassing the second interleave logic 5. A command for changing over the route is transmitted from the CPU 1 to a route changeover logic 6. In FIG. 2, an address signal "00001000" is transmitted to the first interleave logic 4 and converted to an address signal "00000001". By transmitting the address signal "00000001" to the second interleave logic 5, in which the conversion rule of the first interleave logic 4 is reversed, the address signal "00001000" is again finally recovered.

Using the aforementioned principle, the D-RAM or main memory can be accessed at high speed, while the flash or disk-like memory can be precisely accessed.

In the memory access device, the address bus connected from the CPU to the system logic is provided with a first input bus connecting to the interleave unit and a second input bus bypassing the interleave unit. The interleave cancel unit substantially inhibits the interleave operation when data is read from or written to the flash memory, by changing over the first output bus and the second output bus.

In the memory access device, as shown in FIG. 3, the route connected from the CPU 1 to an interleave logic 8 is branched to a route bypassing the interleave logic 8 and connecting to a changeover logic 9. In the memory access device, when the flash memory is accessed, the interleave unit is by-passed. Therefore, the address signal is transmitted from the CPU to the memory unit as it is. Data can be read from or written to contiguously allotted addresses in the flash memory.

In the memory access device according to the invention, the flash memory has an identification information memory portion for storing identification information with which the CPU identifies the flash memory. The CPU is provided with an address designation function for designating an address from or to which data is to be read or written in the memory unit. The CPU is also provided with a flash memory identification function for accessing each memory element in the memory unit, determining which memory element stores the identification information, and determining that the memory element with the identification information stored therein is the flash memory. The CPU is further provided with a flash address determination function for determining which address in the memory unit is allotted for the memory element identified as the flash memory by the flash memory identification function. The CPU also has an interleave cancel function for operating the interleave cancel unit when the address designated by the address designation function corresponds to the address designated by the flash address determination function.

In the memory access device, the memory unit is first accessed and it is determined, via the content of the identification information memory portion of the flash memory, which memory element in the memory unit corresponds to the flash memory. Therefore, it is determined which of the addresses allotted by the CPU in each memory element of the memory unit correspond to the addresses of the flash memory. By identifying the addresses of the flash memory, when the addresses to be accessed are designated by the CPU, it is easily known whether or not the designated addresses correspond to the addresses of the flash memory. When the flash memory is accessed, the interleave operation is canceled, thereby using the flash memory as the disk memory. Conversely, it is easily determined whether or not the addresses designated by the CPU correspond to the addresses of the D-RAM. When the D-RAM is accessed, the interleave operation is not canceled. Therefore, the D-RAM can be accessed at high speed.

The memory access device can be provided with a bit number difference deletion unit for deleting a difference in the number of bits between the CPU and the flash memory, by transmitting a read/write instruction from the CPU to the flash memory, substantially repeatedly corresponding to the number of bits of the flash memory, when the number of bits of the flash memory differs from the number of bits of the CPU.

Even when the number of bits of the flash memory differs from that of the CPU, data can be read or written without any problem.

In the memory access device, the memory unit is provided on a memory board attached to a memory slot of a microcomputer board with the CPU and the system logic mounted thereon.

BRIEF DESCRIPTION OF THE DRAWINGS

The invention will now be described with reference to the drawings, in which:

FIG. 2 is a diagrammatic representation of a memory access device according to the invention;

FIG. 11 is a block diagram showing the structure of computer system according to a second embodiment.

DETAILED DESCRIPTION OF THE PREFERRED EMBODIMENTS

A first embodiment of microcomputer system is now explained.

Figure 4:
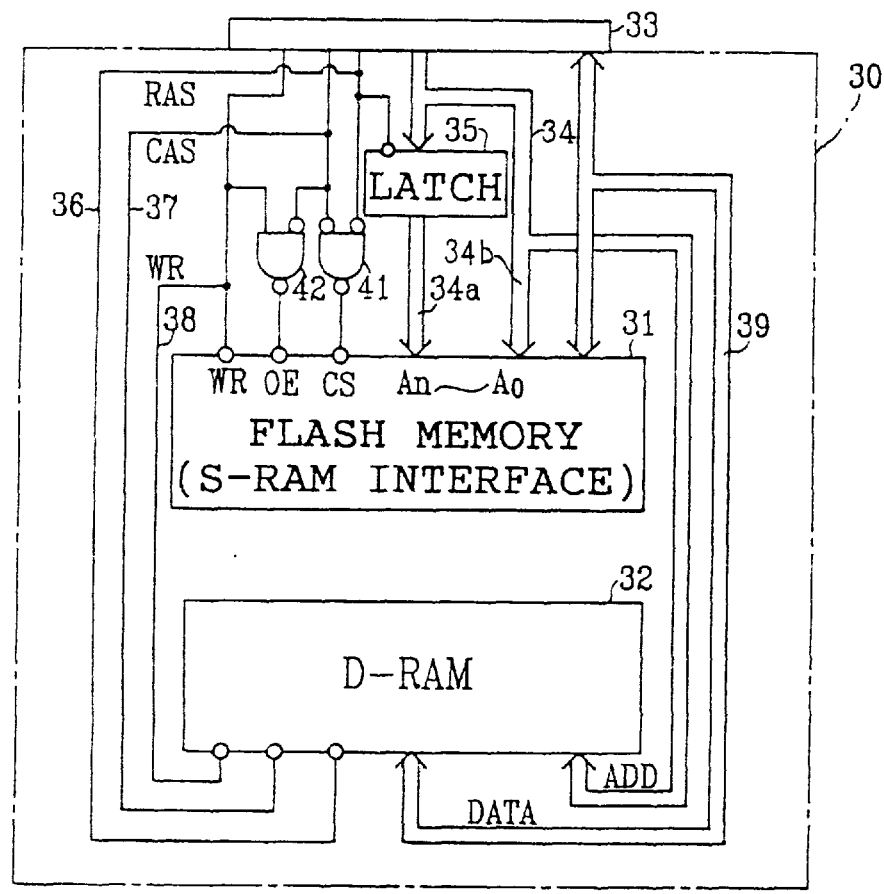
FIG. 4 is a block diagram showing the structure of computer system embodying the invention.

As shown in FIG. 4, the microcomputer system is composed of a microcomputer board 10 with a CPU 11 and a system logic 12 mounted thereon, and a memory board 30 with a flash memory 31 and a D-RAM 32 mounted thereon. The microcomputer board 10 has a memory slot 13 corresponding to a dual in-line memory module (hereinafter referred to as DIMM), and the memory board 30 has a connector 33 corresponding to the DIMM. In the embodiment, the flash memory 31 is provided with one chip for 8 bits, the D-RAM 32 is provided with 2 chips for 16 bits, and the CPU 11 is for 32 bits.

To have an access to the D-RAM 32, the system logic 12 is provided with an interleave logic 14 for converting, according to a specified rule, an address signal transmitted from the CPU 11 and a matrix logic 15 for dividing the address signal converted by the interleave logic 14 into address signals defining a row address and a column address, respectively, in a matrix arrangement. Such system logic, for example, having the tradename PT86C368B and manufactured by CIRRUS LOGIC, INC., is generally used for D-RAM.

The system logic 12 is connected, via an address bus 16 and a data bus 17, to the CPU 11. The address bus 16 and the data bus 17 are also extended from the system logic 12 to the memory slot 13. Also, a row address strobe line (hereinafter referred to as RAS line) 18, a column address strobe line (hereinafter referred to as CAS line) 19 and an instruction signal line for writing (hereinafter referred to as WR line) 20 are extended from the system logic 12 to the memory slot 13. As is known, various signal lines (not shown) are connected to the CPU 11, the system logic 12 and the memory slot 13, and a power circuit (not shown) and other associated elements are also provided.

For example, a flash memory having the tradename 28F400 and manufactured by Intel Co., is available for the flash memory 31 mounted on the memory board 30. Since the flash memory 31 has a S-RAM interface, two address buses 34a and 34b branch from an address bus 34 to connect to the flash memory 31.

The address bus 34a, on one first system route, is provided with a latch circuit 35 which receives a pulse signal from a RAS line 36 and latches the data to be transmitted to the address bus 34. The address bus 34a having the latch circuit 35 on the system route is connected to address terminals corresponding to upper addresses, while the address bus 34b, on the other second system route, is connected to address terminals corresponding to lower addresses, among address terminals Ao to An in the flash memory 31.

The RAS line 36 is connected together with a CAS line 37 to a signal processing circuit 41, and an output line from the signal processing circuit 41 is connected to a CS terminal for defining an address in the flash memory 31. The CAS line 37 is connected together with a WR line 38 to another signal processing circuit 42. An output line from the signal processing circuit 42 is connected to an OE terminal of the flash memory 31, and the WR line 38 is singly connected to a WR terminal of the flash memory 31.

The RAS line 36, the CAS line 37 and the WR line 38 are coupled or branched halfway to the D-RAM 32. The address bus 34 together with a data bus 39 are connected to the flash memory 31 and the D-RAM 32, respectively.

The RAS line 36, the CAS line 37, the WR line 38, the data bus 39 and the address bus 34 are connected to the respective terminals of the D-RAM 32 in a conventional manner. A detailed explanation is omitted for simplicity. The relationship between signals transmitted via the RAS line 36 and other components and operation of the D-RAM 32 is identical to that in a conventional D-RAM, and a detailed explanation of the same is also omitted.

In the embodiment, an ID number identifying a flash memory is already registered in the flash memory 31, irrespective of a memory location defined by an address, such that the ID number can be read from the flash memory 31 upon receipt of an ID reading command transmitted from the CPU 11. Three programs are registered at a specified locations of the flash memory 31, as described later.

Figure 5:
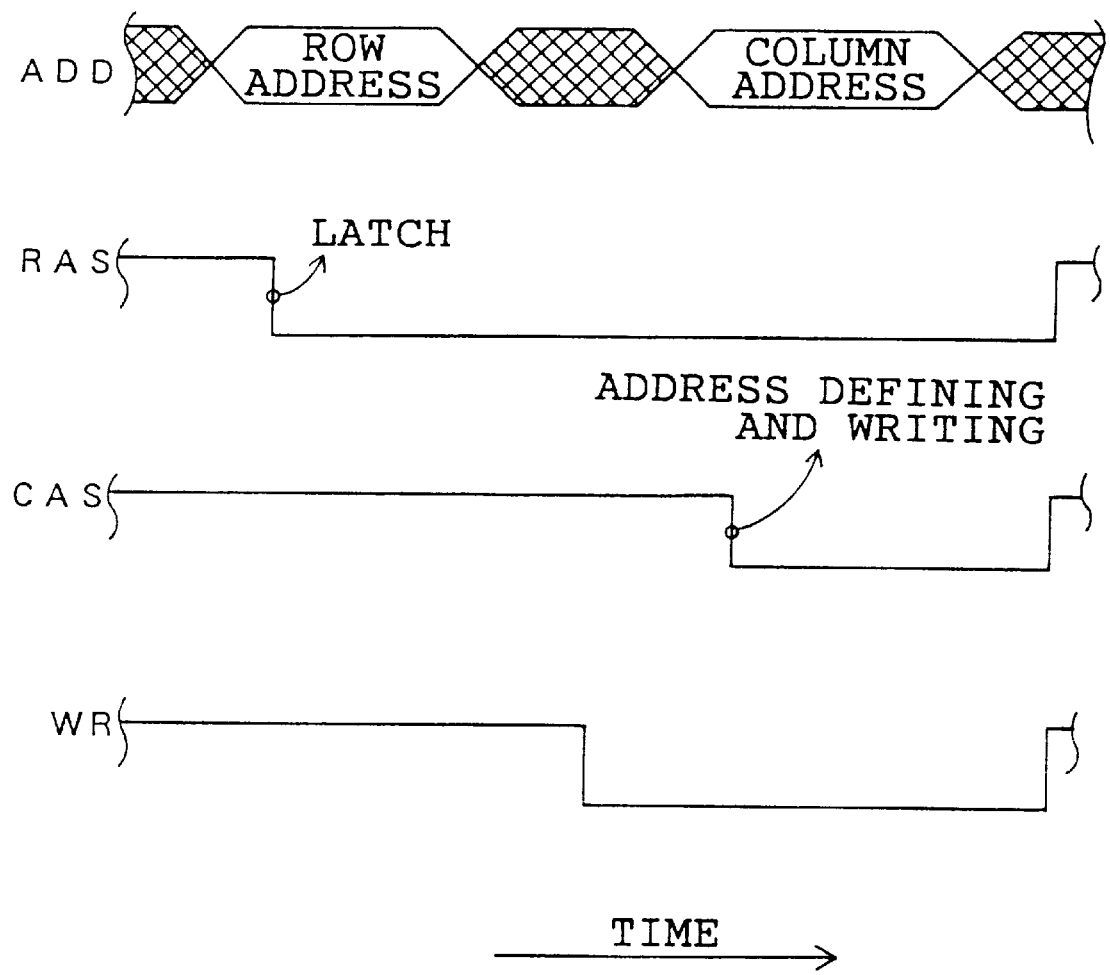
FIG. 5 is a timing chart showing operation of defining addresses in a flash memory of the first embodiment.

The relationship between a signal transmitted via the RAS line 36 and other components, and operation of the flash memory 31, for defining an address in the flash memory 31 is now explained referring to the timing chart of FIG. 5.

As shown in the timing chart, the RAS line 36 transmits a trailing edge signal to the latch circuit 35 at the time a row address signal is transmitted to the address bus 34. Upon receipt of the trailing edge signal, the latch circuit 35, designed as active to a row address signal, is energized to latch the data transmitted via the address bus 34.

At this time, the signal transmitted via the CAS line 37 remains at a high level, the signal processing circuit 41 is transmitting a high level signal and the CS terminal of the flash memory 31 is not actuated. The high level signal transmitted via the CAS line 37 is switched over to a low level signal, at the time a column address signal is transmitted to the address bus 34. In response to the switched signal of the CAS line 37, an output signal from the signal processing circuit 41 changes to a low level signal, and the CS terminal of the flash memory 31 is actuated. The data latched by the latch circuit 35 is determined as an upper address, while the data transmitted via the address bus 34 is determined as a lower address. As a result, one address signal composed of the upper address and the lower address is defined. In this manner the address data transmitted from the microcomputer board 10, which was separated in a row address and a column address, is now converted back to the data able to define one address in the flash memory 31.

When the defined address is accessed for writing, as shown in FIG. 5, an output signal from the WR line 38 switches to a low level signal, at a certain time, thereby actuating the WR terminal of the flash memory 31, and the data transmitted via the data bus 39 is written at the address in the flash memory 31.

When reading data from the address, an output signal from the WR line 38 remains high and the WR terminal is not active. At a certain time, however, the CAS line 37 changes to a low level signal output and the WR line 38 outputs a high level signal, thereby permitting the signal processing circuit 42 to output a low level signal and actuate the OE terminal of the flash memory 31. When the OE terminal is active, the flash memory 31 transmits the data from the specified address to the data bus 39.

The internal structure of the flash memory 31 is now explained.

Figure 6:
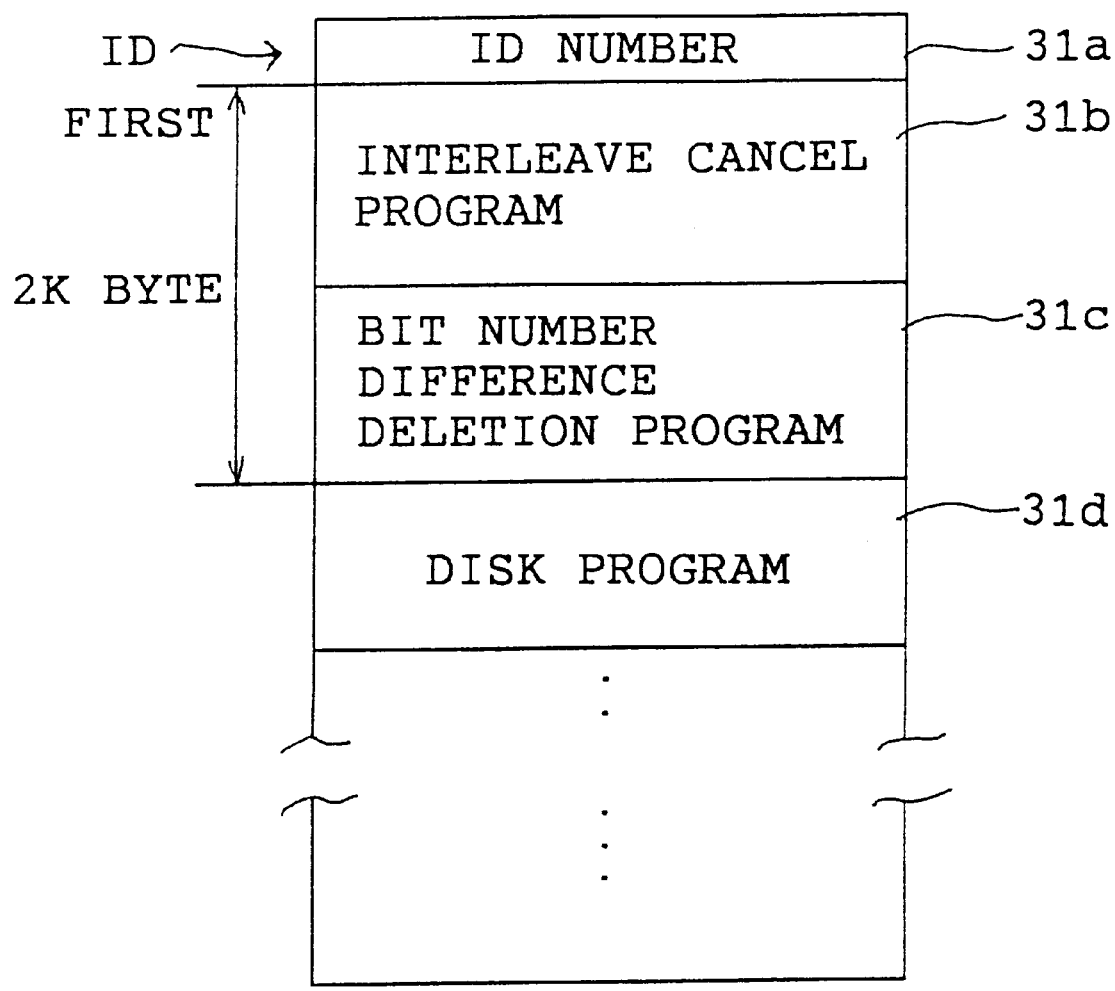
FIG. 6 is an explanatory view showing memory locations of the flash memory in which programs and other information are already registered in the first embodiment.

In the flash memory 31 diagrammatically shown in FIG. 6, the ID number is registered in an ID register portion 31a, irrespective of the address, such that the ID number can be transmitted, in response to an ID reading command transmitted from the CPU 11, from the ID register portion 31a. With the ID number, the memory element is identified as a flash memory for 8 bits.

In a first portion 31b of a first 2K byte memory location defined by the address, a program for substantially canceling interleave operation at the microcomputer board 10 (hereinafter referred to the interleave cancel program) is stored. The 2K byte memory location is of a minimum page size and can store contiguous address data irrespective of the interleave operation.

A second portion 31c of the first 2K byte memory location stores a program for deleting a difference in the number of bits (hereinafter referred to as the bit number difference deletion program), such that the flash memory 31 for 8 bits and the D-RAM 32 for 16 bits can normally operate corresponding to the CPU 11 for 32 bits.

A program for deleting data by a unit of 64K byte (hereinafter referred to as the disk program) is stored in a third portion 31d of the memory location other than the first 2K byte memory location.

An operation in the computer system of this embodiment is now explained.

Figure 7:
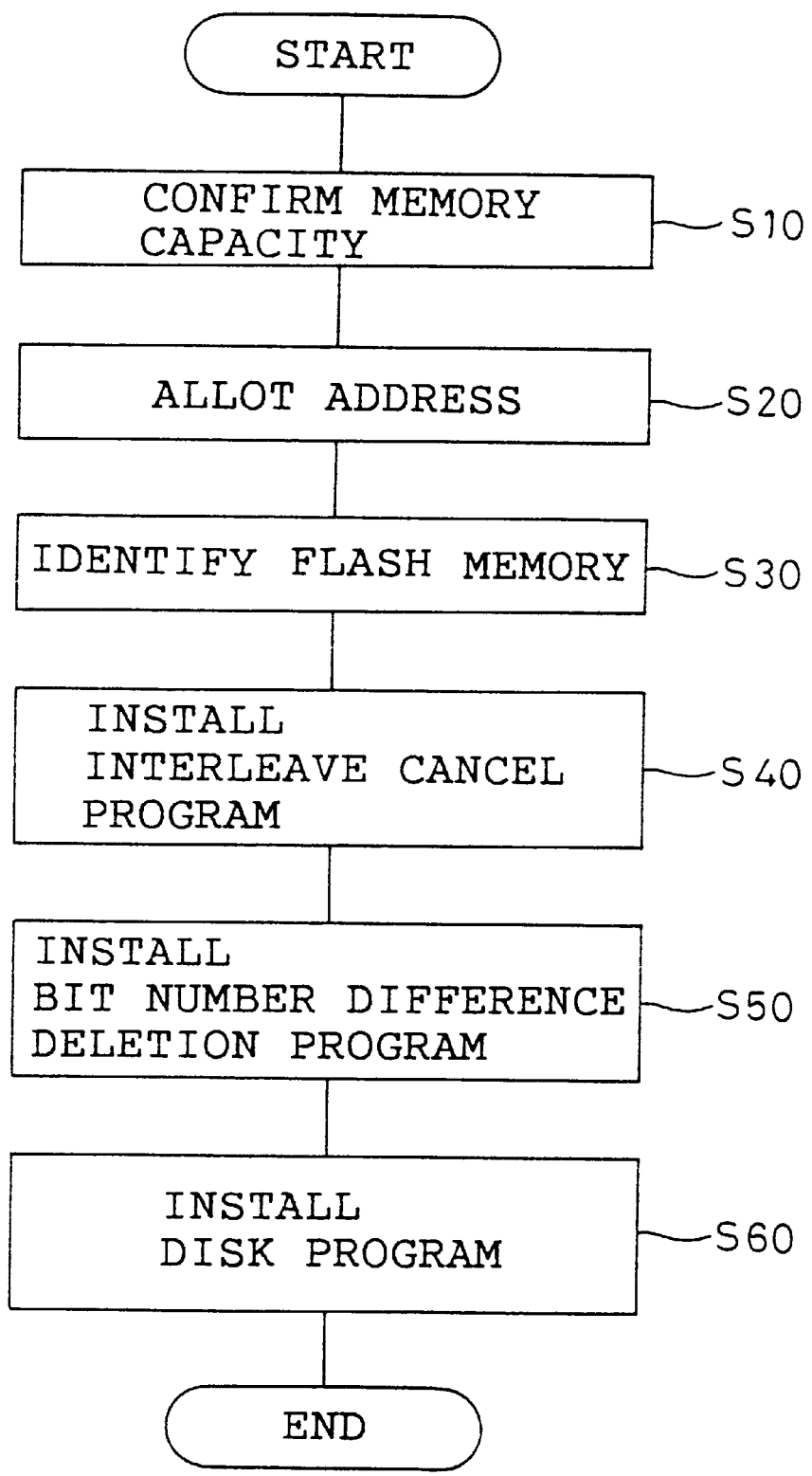
FIG. 7 is a flowchart of initialization of the first embodiment.

When a power supply is connected, the CPU 11 executes the process shown in the flowchart of FIG. 7.

As shown in that flow chart, at step S10 the memory board 30 is accessed to confirm the capacity of the memory elements 31 and 32. At step S20, addresses in the memory elements 31, 32 to be accessed by the CPU 11 are allotted over the memory board 30. For example, after it is determined that the first accessed memory element has addresses 1 to X, it is determined that the subsequent memory element has addresses starting from X+1. The addresses are allotted in the memory elements as viewed from the CPU 11.

At step S30, the flash memory 31 is identified. Specifically, by determining whether or not the ID number of the flash memory is stored in the ID register portion 31a of the memory element 31, 32, it is determined which of the addresses allotted, at step S20, correspond to those of the flash memory 31.

Through the process executed by steps S10–S30, addresses are allotted contiguously by the CPU 11 in all the memory locations of the memory board 30. Subsequently, the addresses of the flash memory 31, to be accessed by the CPU 11, can be identified.

Subsequently, at step S40 the first portion 31b of the memory location of the flash memory 31 is accessed to read therefrom the interleave cancel program, and the interleave cancel program is installed in the D-RAM 32. In the first embodiment, the D-RAM 32 is a main memory of the CPU 11.

To read the interleave cancel program, a bus width is fixed in the CPU 11 as 8 bits by a main basic input/output system (hereinafter referred to as the main BIOS). This imparts versatility such that the flash memory 31 for any number of bits can be sent to the memory board 30.

Following the interleave cancel program, the second portion 31c of the memory location of the flash memory 31 is accessed at step S50, to read therefrom the bit number difference deletion program and the bit number difference deletion program is installed in the D-RAM 32. These two programs are not very large in size, and are stored contiguously in the first 2K byte memory location irrespective of the interleave operation. Therefore, the programs can be installed on the 8 bit bus in a short period of time.

While the bit number difference deletion program and the interleave cancel program are being installed, the portion 31d of the memory location is accessed, at step S60, to read therefrom the disk program and the disk program is installed in the D-RAM 32. The disk program is of a large size and cannot be stored within the minimum page size of the flash memory 31. Therefore, the disk program is required to be read while the interleave is being canceled. Further, by actuating the bit number difference deletion program, the bus width is set as 16 bits corresponding to the flash memory 31 for 16 bits, and then the disk program can be read more efficiently as compared with a bus width of 8 bits.

Figure 8:
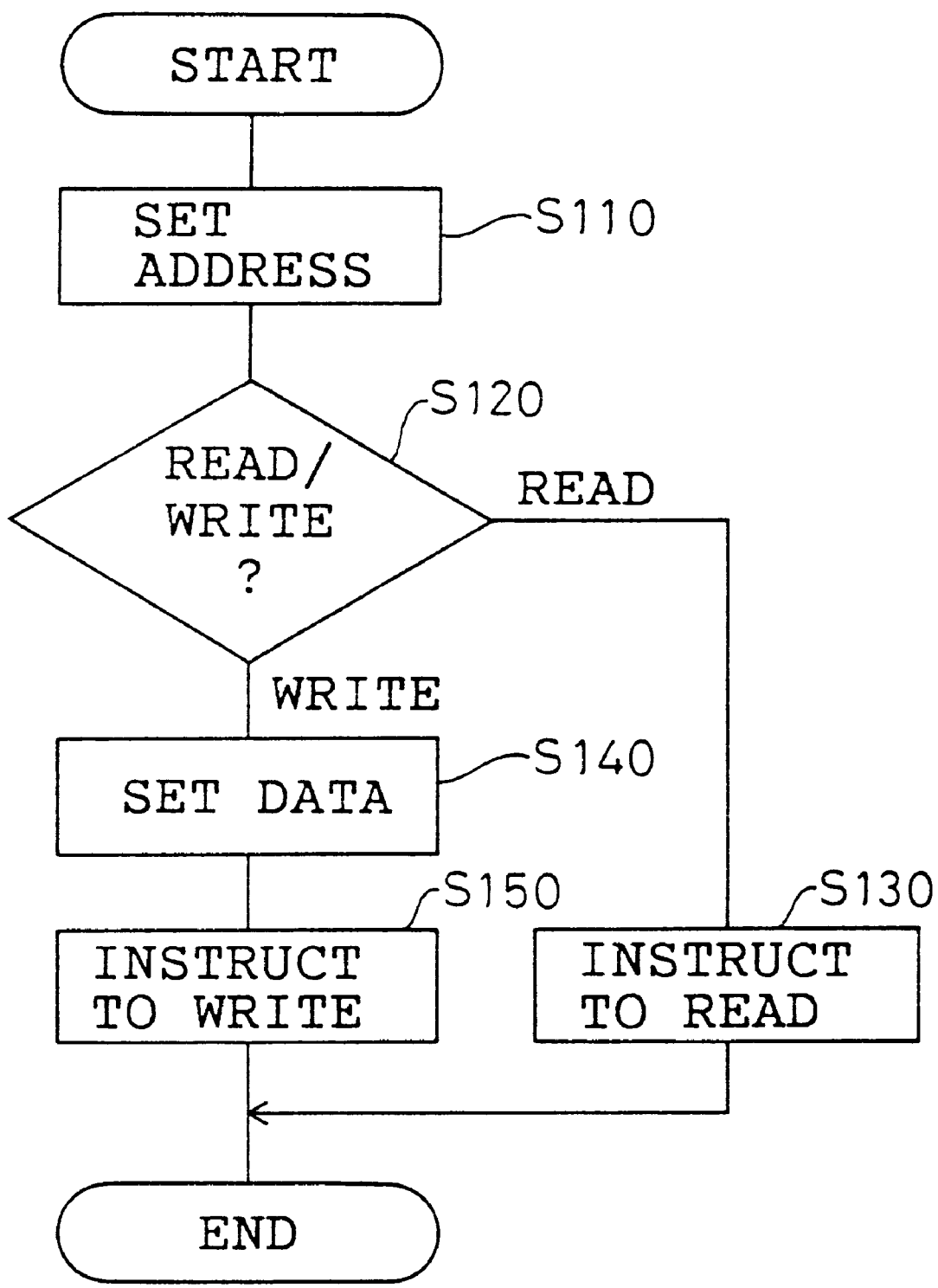
FIG. 8 is a flowchart of memory access process of the first embodiment.

The reading and writing of data by the CPU 11 is now explained referring to the flowchart of FIG. 8.

First at step S110, an address to be accessed is determined and set on the address bus 16 by the CPU 11. It is determined, at step S120, whether data is to be read from or written into the address set at step S110. When it is determined at step S120 to read data from the address, an instruction for reading is transmitted to the system logic 12, at step S130. When it is determined at step S120 to write data to the address, data to be written is set on the data bus 17, at step S140, and, at step S150, an instruction for writing is transmitted to the system logic 12.

Figure 9:
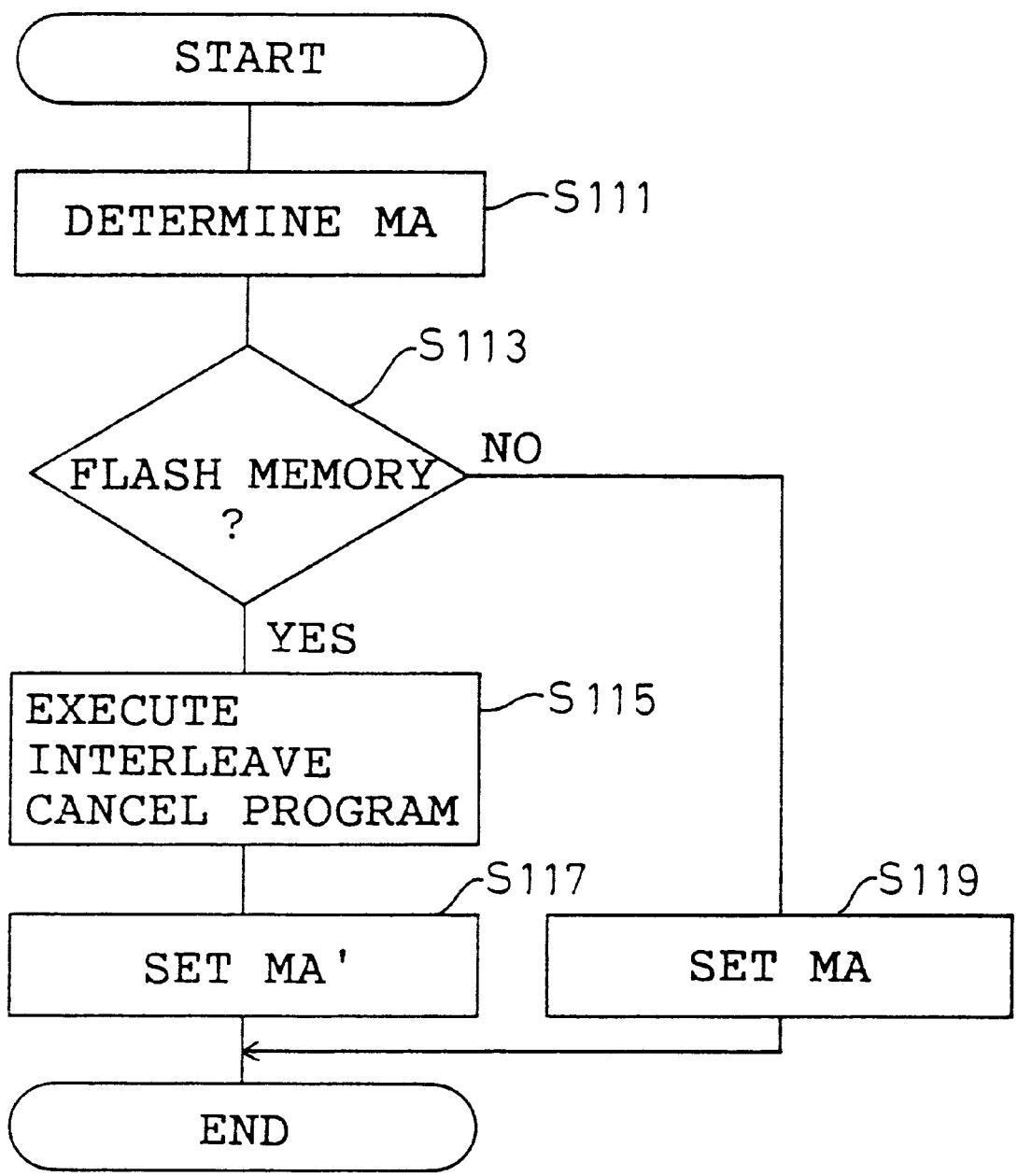
FIG. 9 is a flowchart for the interleave cancel process of the first embodiment.

The step S110 of setting the address is detailed in the flowchart of FIG. 9.

First, at step S111, an address MA is determined and it is determined, at step S113, whether or not the address MA is in the flash memory 31. When the answer to step S113 is affirmative, the interleave cancel program first read is executed, at step S115, thereby converting the address MA to an address MA' and, at step S117, the converted address MA' is set on the address bus 16. When the answer to the step S113 is negative, the address MA is set, at step S119, as it is without being converted.

Figure 1A:
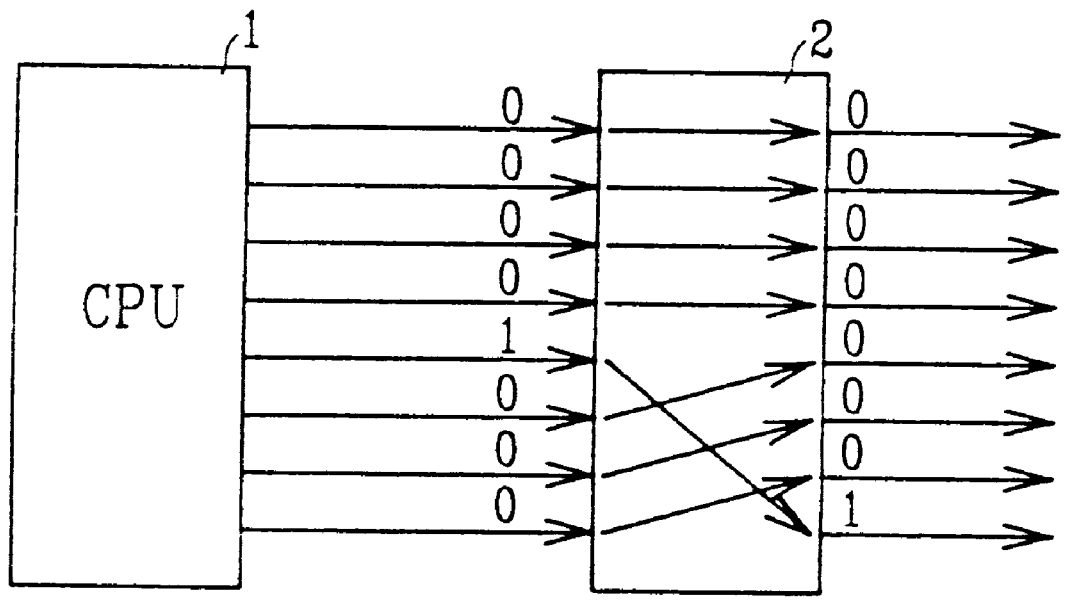
FIGS. 1A and 1B are diagrammatic representations illustrating a memory access method according to the present invention.
Figure 1B:
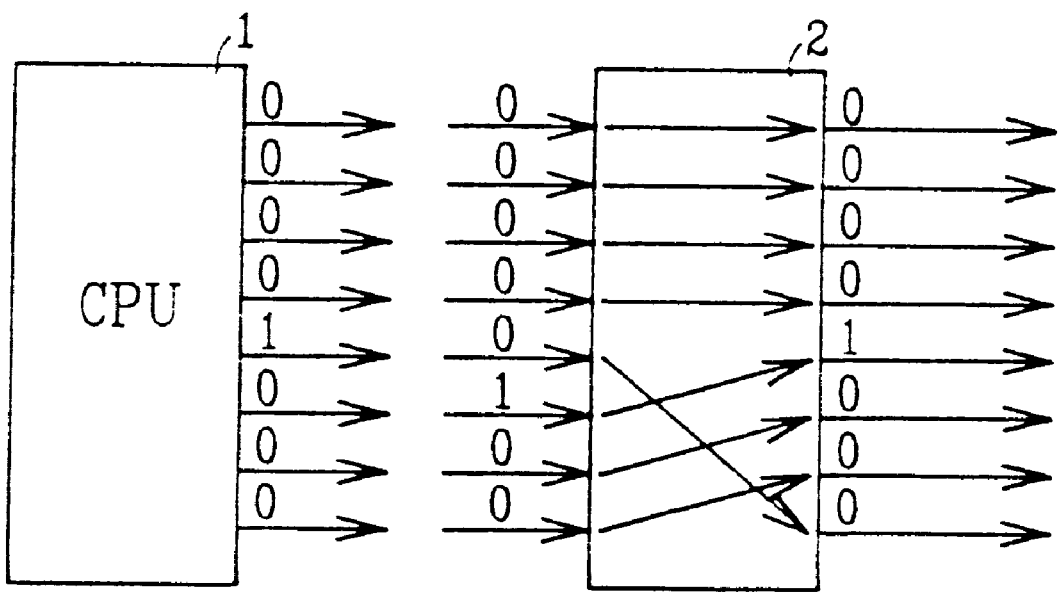
Figure 3:
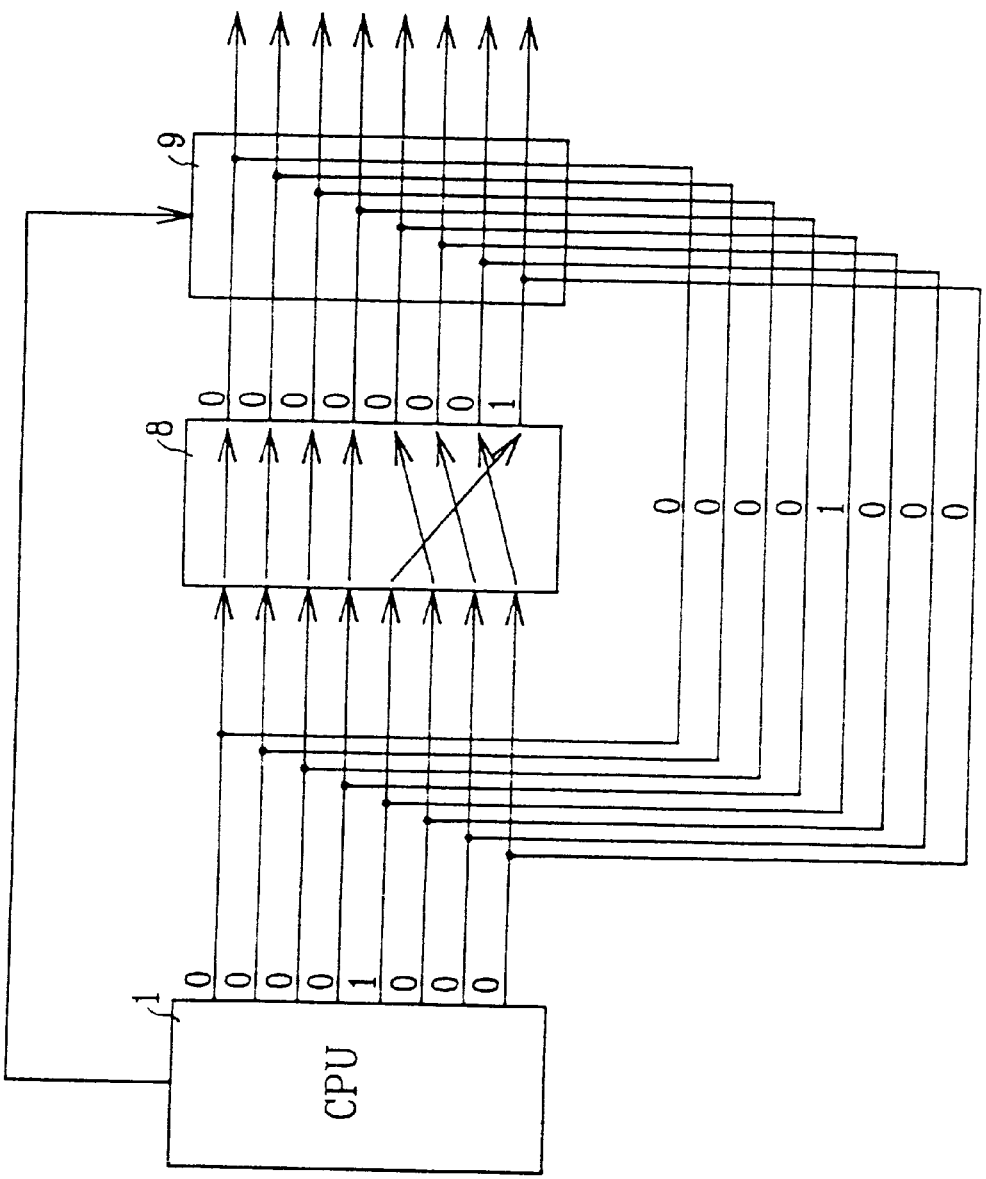
FIG. 3 is a diagrammatic representation of another memory access device according to the invention.

The interleave cancel program is executed in the same manner as that diagrammatically shown in FIG. 1. Specifically, when the address to be transmitted to the interleave logic 14 is set as X and the address to be transmitted from the interleave logic 14 is set as Y, the relationship between the addresses X and Y is represented as a functional equation Y=f(X). The functional equation is inversely converted to a functional equation X=g(Y), in which Y is a variable. An idea of the interleave cancel program is that X is obtained for imparting Y using the functional equation X=g(Y).

The interleave has various rules and these rules vary with the conditions of the interleave logic, which vary with the minimum page size of D-RAM. In the embodiment, the minimum page size of the D-RAM 32 is 2K byte.

In the embodiment, a plurality of functional equations corresponding to the aforementioned X=g(Y), and a table showing the correspondence of the functional equations to the types of interleave logic are stored in the first portion 31b, for storing the interleave cancel program, of the flash memory 31. When the interleave cancel program is installed in the D-RAM 32 by the CPU 11, by referring to a correspondence table, a functional equation is selected, corresponding to that of the interleave logic 14 built in the CPU 11, and is installed as the functional equation for use in the interleave cancel program.

As aforementioned, when the flash memory 31 of the memory board 30 is accessed by the CPU 11, in the embodiment, the interleave cancel program is executed. Instead of the address MA, a function X=MA' is transmitted to the interleave logic, such that the address transmitted from the interleave logic 14 is returned back to MA. The function X=MA' is obtained by substituting MA for the variable Y in the functional equation X=g(Y). Data, programs or other information can be written contiguously in the flash memory 31 according to linearly continuous addresses which are determined by the CPU by considering the flash memory 31 as a disk-like memory.

Therefore, when data or programs need to be re-written, the first installed disk program is actuated, the data in one contiguous 64K byte block is deleted, and replaced with new data through the writing process. In this manner, the flash memory 31 can have a memory function identical to that of a hard disk, a floppy disk or some other disk. A series of data are written at contiguous addresses of the flash memory 31, and the block of data is deleted from the flash memory 31 without even partly deleting the other series of data. Data can be read from or written in the addresses of the flash memory 31 in the same manner as in the disk memory. In the embodiment, the memory location other than the portions 31a to 31d can have data written therein. Data is divided into blocks, each block consisting of 64K byte. As aforementioned, addresses are allotted by the CPU 11 to the entire memory board 30 including both the flash memory 31 and the D-RAM 32 by the CPU 11. It is calculated which of the allotted addresses correspond to one block of data, by executing the interleave cancel program immediately after the interleave cancel program is installed in D-RAM 32. The result of calculation is written in the D-RAM 32, and is referred to when the flash memory 31 is accessed to write data therein. The block of data in the corresponding addresses of the flash memory 31 is deleted, and replacement data is written at the addresses. The flash memory 31 has a disk-like function.

On the other hand, when the D-RAM 32 is accessed, the interleave cancel program is not executed. Therefore, the D-RAM 32 can be accessed efficiently through the interleave function, and the function of the D-RAM 32, as the main memory of the CPU 11, is prevented from being impaired.

At steps S130 and S150, the reading instruction and the writing instruction are transmitted to the system logic 12, respectively, by means of an output signal from the RAS line, the CAS line and the WR line.

Specifically, the row address is first set on the address bus 16, at step S130, thereby changing an output signal of the RAS line from a high level to a low level signal, and, subsequently, the column address is set on the address bus 16, thereby changing an output signal of the CAS line from a high level to a low level signal, while maintaining the output signal of the WR line at a high level. As shown in FIG. 4, the signal processing circuit 42 actuates the OE terminal of the flash memory 31 when the output signal of the CAS line is at a low level and the output signal of the WR line is at a high level, thereby permitting data to be read.

At step S140, the data to be written is set on the data bus 17, the row address is first set on the address bus 16, at step S150, thereby changing an output signal of the RAS line from a high level to a low level signal. Subsequently, the column address is set on the address bus 16, thereby changing an output signal of the CAS line from a high level to a low level signal. The output signal of the WR line is changed from a high level to a low level signal. As shown in FIG. 4, the signal processing circuit 42 actuates the WR terminal of the flash memory 31, thereby permitting data to be written to the flash memory 31.

At this time, the first installed bit number difference deletion program is executed, such that data can be read from or written into the flash memory 31 by the CPU 11 for 8, 16, or 32 bits.

Figure 10:
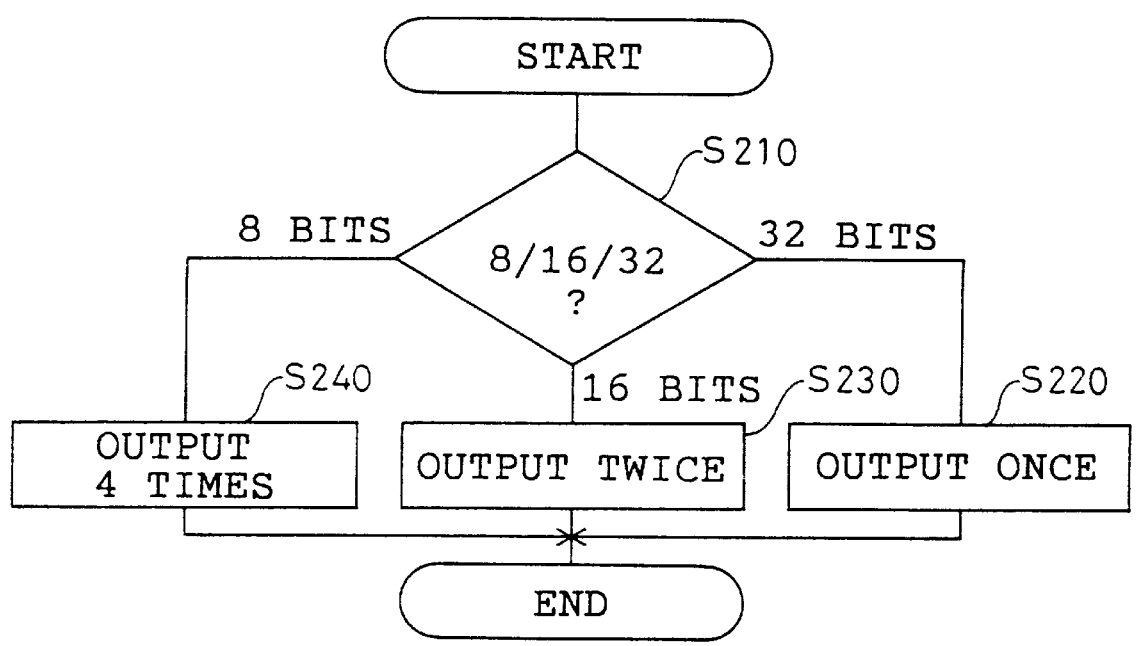
FIG. 10 is a flowchart for the process for deleting a difference in the number of bits between CPU and the flash memory according to the first embodiment.

The bit number difference deletion program is now explained referring to a flowchart of FIG. 10.

First, it is determined, at step S210, with the first read ID number of the flash memory 31 whether the flash memory 31 to be accessed is of 8 bits, 16 bits or 32 bits.

When the flash memory 31 is of 32 bits, the bus width is set as 32 bits and, at step S220, a reading/writing instruction signal is transmitted from the CPU to the flash memory 31. When the flash memory 31 corresponds to 16 bits, however, the bus width is set as 16 bits and, at step S230, the instruction signal is transmitted twice. When the flash memory 31 is set as 8 bits, the bus width is set as 8 bits and, at step S240, the instruction signal is transmitted four times.

In the embodiment, the RAS lines 18, 36 and the CAS lines 19, 37 are composed of four signal lines RAS0 to RAS 3 and CAS0 to CAS3, respectively. For 32 bits, a signal is transmitted to these four signal lines at the same time. For 16 bits, the signal lines are divided into a group consisting of RAS0, RAS1, CAS0 and CAS1 and a group of RAS2, RAS3, CAS2 and CAS3, and a signal is transmitted serially twice to the two groups. For 8 bits, the signal lines are divided into a group consisting of RAS0 and CAS0, a group of RAS1 and CAS1, a group of RAS2 and CAS2, and a group of RAS3 and CAS3, and a signal is transmitted serially four times to the four groups.

In the embodiment, in the flowchart of FIG. 10, when the bit number difference deletion program is executed, the process only goes to step S240, at which the writing/reading instruction signal from CPU is transmitted four times to the flash memory 31, since the flash memory 30 is for 8 bits. For example, however, by mounting two units of flash memory 31 on the memory board 30, the process can advance to step S230, at which the instruction signal is transmitted twice, because the flash memories are of 16 bits. Therefore, the capacity of the flash memory mounted on the memory board 30 needs to be confirmed at step S210.

As aforementioned, the memory board 30 of the embodiment, which is provided with both the main memory of CPU and the disk-like memory, is a superior memory for a small-sized electronic apparatus. By installing the bit number difference deletion program in the D-RAM 32, such that the flash memory of 8 bits corresponds to the CPU of 32 bits, the memory board 30 can also be of smaller size. Conventionally, four units of flash memory of 8 bits are required to correspond to CPU of 32 bits. In the embodiment, however, since the flash memory of 8 bits can correspond to CPU of 32 bits, even one unit of flash memory is sufficient for the memory board, and the memory board can thus be of smaller size.

Since the computer system according to the first embodiment is provided with an interleave cancel function, data, programs or other information is written at contiguous addresses. Such writing condition coincides with a property of flash memory that data is canceled from a 64K byte memory location unit. Consequently, the interleave cancel function is important and effective, in that the D-RAM is accessible at high speed through interleave and the flash memory is writable in a disk manner and both coexist on one memory board.

A second embodiment is now explained.

As shown in FIG. 11, different from the first embodiment shown in FIG. 4, in a computer system according to the second embodiment a flash memory 51 of 16 bits having a D-RAM interface is mounted on a memory board 50. Conceptually, the latch circuit 35, the signal processing circuit 41 and the two branched address bus 34a, 34b of the first embodiment shown in FIG. 4 are built in the flash memory 51. Addresses are allotted contiguously in the flash memory 51 in the same manner as in the flash memory 31 of the S-RAM interface. By executing the latching process in the flash memory 51, one address signal, having the row address as an upper address and the column address as a lower address, is recovered and an address is specified. Although the flash memory of 16 bits with the D-RAM interface attached thereto is currently rare in the market place, a flash memory having the tradename 28F016DX and manufactured by Intel Co. can be used as the flash memory 51.

The other structure of the memory board 50, of the second embodiment, is similar to that in the first embodiment and is denoted with the same reference numerals as those for the first embodiment, shown in FIG. 4, but not explained in further detail. The interleave cancel program and other features are also similar to those in the first embodiment and thus are not explained in further detail.

This invention has been described above with reference to the preferred embodiments as shown in the figures. Modifications and alterations may become apparent to one skilled in the art upon reading and understanding the specification. Despite the use of embodiments for illustration purposes, the invention is intended to include all such modifications and alterations within the spirit and scope of the appended claims.

For the memory board, a single inline memory module, abbreviated as SIMM, can be used. Software in the memory board can be replaced by hardware, or an algorithm can be set in any manner, if interleave operation is substantially canceled when the flash memory is accessed.

What is claimed is:

1. A memory access method for converting an address designated by a CPU through an interleave operation and transmitting the converted address to a memory means when reading or writing data from or to said memory means, said memory means being provided with memory elements comprising a D-RAM and a flash memory connected via a data bus, an address bus and a control signal line to said CPU such that said CPU can access both said D-RAM and said flash memory;

said memory access method comprising the step of:
when the address designated by said CPU corresponds to the address in said flash memory, converting the address designated by said CPU, using a rule of said interleave operation in reverse before said interleave operation is executed such that the address converted through said interleave operation coincides with the original address designated by said CPU.

2. A memory access method according to claim 1, further comprising the steps of providing said CPU with access to each of said memory elements of said memory means, and identifying which memory element corresponds to the flash memory, and, according to identification results, determining whether the address to be designated by said CPU corresponds to the address in said flash memory or the address in said D-RAM.

3. A memory access method according to claim 1, further comprising the step of, when the number of bits of said flash memory differs from the number of bits of said CPU, deleting the difference in the number of bits between said CPU and said flash memory by transmitting a read/write instruction from said CPU to said flash memory corresponding to the number of bits of the flash memory.

4. A memory access device, comprising
a CPU;
a system logic connected to an address bus of said CPU and having an interleave means for converting an address signal, transmitted from said CPU according to a specified rule, and transmitting the converted address signal to a memory means;
said memory means is provided with memory elements comprising a D-RAM and a flash memory connected in parallel with each other via a data bus, an address bus and a control signal line such that said CPU can access both said D-RAM and said flash memory;
a memory element identification means for determining whether or not the memory element to be accessed by said CPU for reading or writing data corresponds to said flash memory; and
an interleave cancel means for inhibiting said interleave means from operating, when said memory element identification means determines that the memory element from or to which data is to be read or written is said flash memory.

5. A memory access device according to claim 4, wherein said interleave cancel means converts an address designated by said CPU, using said specified rule in reverse, and transmits the converted address to said interleave means such that the address converted by said interleave means coincides with the original address designated by said CPU.

6. A memory access device according to claim 4, wherein an address bus, connected to said first interleave means is provided with a first output bus coupled to a second interleave means for reversing a conversion of an address signal transmitted by said first interleave means, and a second output bus bypassing said second interleave means; and said interleave cancel means inhibits said second interleave means from operating when data is read from or written to said flash memory, by changing from said second output bus to said first output bus.

7. A memory access device according to claim 4,
wherein the address bus, connected between said CPU and said system logic, is provided with a first input bus connecting to said interleave means and a second input bus bypassing said interleave means; and
said interleave cancel means inhibits said interleave means from operating when data is read from or written to said flash memory, by changing from said first output bus to said second output bus.

8. A memory access device according to claim 4, wherein said flash memory has an identification information memory portion for storing identification information with which said CPU identifies said flash memory; and said CPU is provided with:
an address designation means for designating an address from or to which data is to be read or written in said memory means;
a flash memory identification means for accessing each memory element in said memory means, determining which memory element stores said identification information and determining that the memory element with said identification information stored therein is said flash memory;
a flash address determination means for determining which address in said memory means is allotted for said memory element identified as said flash memory by said flash memory identification means; and
an interleave cancel means for operating when the address designated by said address designation means corresponds to the address designated by said flash address determination means.

9. A memory access device according to claim 4, wherein, when the number of bits of said flash memory differs from the number of bits of said CPU, said memory access device is provided with a bit number difference deletion means for deleting a difference in the number of bits between said CPU and said flash memory by transmitting a read/write instruction from said CPU to said flash memory corresponding to the number of accessible bits when said CPU accesses said flash memory once.

10. A memory access device according to claim 4, wherein said memory means is provided on a memory board attached to a memory slot of a microcomputer board with said CPU and said system logic mounted thereon.

11. A memory board for attachment to a memory slot of a microcomputer board having a CPU mounted thereon, said memory board including memory elements, wherein:
the memory elements comprise a D-RAM and a flash memory mounted for storing data;
the flash memory has an S-RAM interface;
said D-RAM and said flash memory are connected to said CPU on said microcomputer board via a data bus, an address bus and a control signal line such that said D-RAM and said flash memory can be accessed by said CPU on the microcomputer board;
said address bus is connected to said flash memory via a first route having a latch circuit and a second route without a latch circuit;
a row address strobe line is connected to said latch circuit such that an operation signal is transmitted to said latch circuit when a row address signal is transmitted via the address bus; and said row address strobe line and a column address strobe line are connected to said flash memory via a specified signal process circuit such that an operation signal is transmitted for defining an address to said flash memory when a column address signal is transmitted to said address bus.

12. A memory board according to claim 11, wherein said flash memory has a disk-like deletion procedure memory portion for storing a program, processable by said CPU, for deleting data from a memory area of said flash memory composed of at least one block which has a unit of specified bytes with contiguous addresses.

13. A memory board according to claim 11, wherein said flash memory has a corresponding bit number difference deletion procedure memory portions for storing a program, processable by said CPU, for deleting a difference in the number of bits between said CPU and said flash memory, by transmitting a read/write instruction from said CPU to said flash memory corresponding to the number of bits of said flash memory, when the number of bits of said flash memory differs from the number of bits of said CPU.

14. A memory board for attachment to a memory slot of a microcomputer board having a CPU mounted thereon, said memory board including memory elements, wherein:
the memory elements comprise a D-RAM and a flash memory mounted for storing data;
said D-RAM and said flash memory are connected to said CPU on said microcomputer board via a data bus, an address bus and a control signal line such that said D-RAM and said flash memory can be accessed by said CPU on the microcomputer board; and
said flash memory has an interleave cancel procedure memory portion for storing a program, processable by said CPU, for canceling an interleave operation executed by said microcomputer board and writing data in contiguously allotted addresses in said flash memory.

15. A memory board according to claim 14, wherein:
said flash memory has a D-RAM interface; and
said flash memory and said D-RAM are connected in parallel with a row address strobe line and a column address strobe line.

16. A memory board according to claim 14, wherein said flash memory has a disk-like deletion procedure memory portion for storing a program, processable by said CPU, for deleting data from a memory area of said flash memory composed of at least one block which has a unit of specified bytes with contiguous addresses.

17. A memory board for attachment to a memory slot of a microcomputer board having a CPU mounted thereon, said memory board including memory elements, wherein:
said memory elements comprise a D-RAM and a flash memory mounted for storing data;
said D-RAM and said flash memory are connected to said CPU on said microcomputer board via a data bus, an address bus and a control signal line such that said D-RAM and said flash memory can be accessed by said CPU on the microcomputer board; and
said flash memory has an identification information memory portion for storing identification information by which said CPU can identify address locations of said flash memory.

18. A memory board according to claim 17, wherein:
said flash memory has a D-RAM interface; and
said flash memory and said D-RAM are connected in parallel with a row address strobe line and a column address strobe line.

19. A memory board according to claim 17, wherein said flash memory has a disk-like deletion procedure memory portion for storing a program, processable by said CPU, for deleting data from a memory area of said flash memory composed of at least one block which has a unit of specified bytes with contiguous addresses.

20. A memory board according to claim 17, wherein said identification information indicates, once said flash memory is accessed, the number of accessible bits.

21. A memory board for attachment to a memory slot of a microcomputer board having a CPU mounted thereon, said memory board including memory elements, wherein:
said memory elements comprise a D-RAM and a flash memory mounted for storing data;
said D-RAM and said flash memory are connected to said CPU on said microcomputer board via a data bus, an address bus and a control signal line such that said D-RAM and said flash memory can be accessed by said CPU on the microcomputer board; and
said flash memory has a corresponding bit number difference deletion procedure memory portion for storing a program, processable by said CPU, for deleting a difference in the number of bits between said CPU and said flash memory, by transmitting a read/write instruction from said CPU to said flash memory corresponding to the number of bits of said flash memory, when the number of bits of said flash memory differs from the number of bits of said CPU.

22. A memory board according to claim 21, wherein:
said flash memory has a D-RAM interface; and
said flash memory and said D-RAM are connected in parallel with a row address strobe line and a column address strobe line.

23. A memory board according to claim 21, wherein said flash memory has a disk-like deletion procedure memory portion for storing a program, processable by said CPU, for deleting data from a memory area of said flash memory composed of at least one block which has a unit of specified bytes with contiguous addresses.

* * * * *